(12) United States Patent
Emoto et al.

(10) Patent No.: US 10,611,956 B2
(45) Date of Patent: Apr. 7, 2020

(54) PHOSPHOR, LIGHT EMITTING DEVICE, AND METHOD FOR PRODUCING PHOSPHOR

(71) Applicant: Denka Company Limited, Tokyo (JP)

(72) Inventors: Hideyuki Emoto, Fukuoka (JP); Motoi Tanaka, Tokyo (JP); Kazuhiro Ito, Tokyo (JP)

(73) Assignee: Denka Company Limited, Tokyo (JP)

( * ) Notice: Subject to any disclaimer, the term of this patent is extended or adjusted under 35 U.S.C. 154(b) by 487 days.

(21) Appl. No.: 15/546,400

(22) PCT Filed: Jan. 27, 2016

(86) PCT No.: PCT/JP2016/052360
§ 371 (c)(1),
(2) Date: Nov. 14, 2017

(87) PCT Pub. No.: WO2016/121823
PCT Pub. Date: Aug. 4, 2016

(65) Prior Publication Data
US 2018/0072946 A1 Mar. 15, 2018

(30) Foreign Application Priority Data
Jan. 27, 2015 (JP) .................................. 2015-013263

(51) Int. Cl.
*C09K 11/61* (2006.01)
*C09K 11/66* (2006.01)
(Continued)

(52) U.S. Cl.
CPC .............. *C09K 11/61* (2013.01); *C09K 11/55* (2013.01); *C09K 11/57* (2013.01); *C09K 11/616* (2013.01);
(Continued)

(58) Field of Classification Search
CPC ...... C09K 11/57; H01L 33/502; H01L 33/504
See application file for complete search history.

(56) References Cited

U.S. PATENT DOCUMENTS 8,491,816 B2* 7/2013 Hong ................... C09K 11/616
252/301.4 H
10,294,418 B2* 5/2019 Kaneyoshi ........... C01G 19/006
(Continued)

FOREIGN PATENT DOCUMENTS

JP 2009528429 A 8/2009
JP 2010209311 A 9/2010
(Continued)

OTHER PUBLICATIONS

International Search Report from corresponding PCT/JP2016/052360 dated Apr. 12, 2016.

*Primary Examiner* — C Melissa Koslow
(74) *Attorney, Agent, or Firm* — Caesar Rivise, PC

(57) ABSTRACT

Provided is a phosphor represented by the general formula: $A_2MF_6$:Mn. The elements A each represents an alkali metal element, the element M represents one or more tetravalent metallic elements selected from Si, Ge, Sn, Ti, Zr and Hf. The phosphor has a minimal light absorption rate in a wavelength range of 300 nm or more and 350 nm or less of 67% or less, and a maximum light absorption rate in a wavelength range of 400 nm or more and 500 nm or less of 65% or more. The phosphor has a Mn content of 0.3% by mass or more and 1.5% by mass or less.

9 Claims, 1 Drawing Sheet

(51) Int. Cl.
- *H01L 33/50* (2010.01)
- *C09K 11/57* (2006.01)
- *C09K 11/55* (2006.01)
- *C09K 11/67* (2006.01)
- *G02B 5/00* (2006.01)

(52) U.S. Cl.
CPC ............ *C09K 11/617* (2013.01); *C09K 11/66* (2013.01); *C09K 11/677* (2013.01); *G02B 5/003* (2013.01); *H01L 33/50* (2013.01); *H01L 33/502* (2013.01); *H01L 33/504* (2013.01)

(56) References Cited

U.S. PATENT DOCUMENTS

| | | |
|---|---|---|
| 2006/0169998 A1 | 8/2006 | Radkov et al. |
| 2010/0142189 A1 | 6/2010 | Hong et al. |
| 2013/0241396 A1 | 9/2013 | Hiramatsu et al. |

FOREIGN PATENT DOCUMENTS

| | | | |
|---|---|---|---|
| JP | 201314715 A | | 1/2013 |
| WO | 2013137144 A1 | | 9/2013 |
| WO | WO 2015/115195 | * | 8/2015 |

* cited by examiner

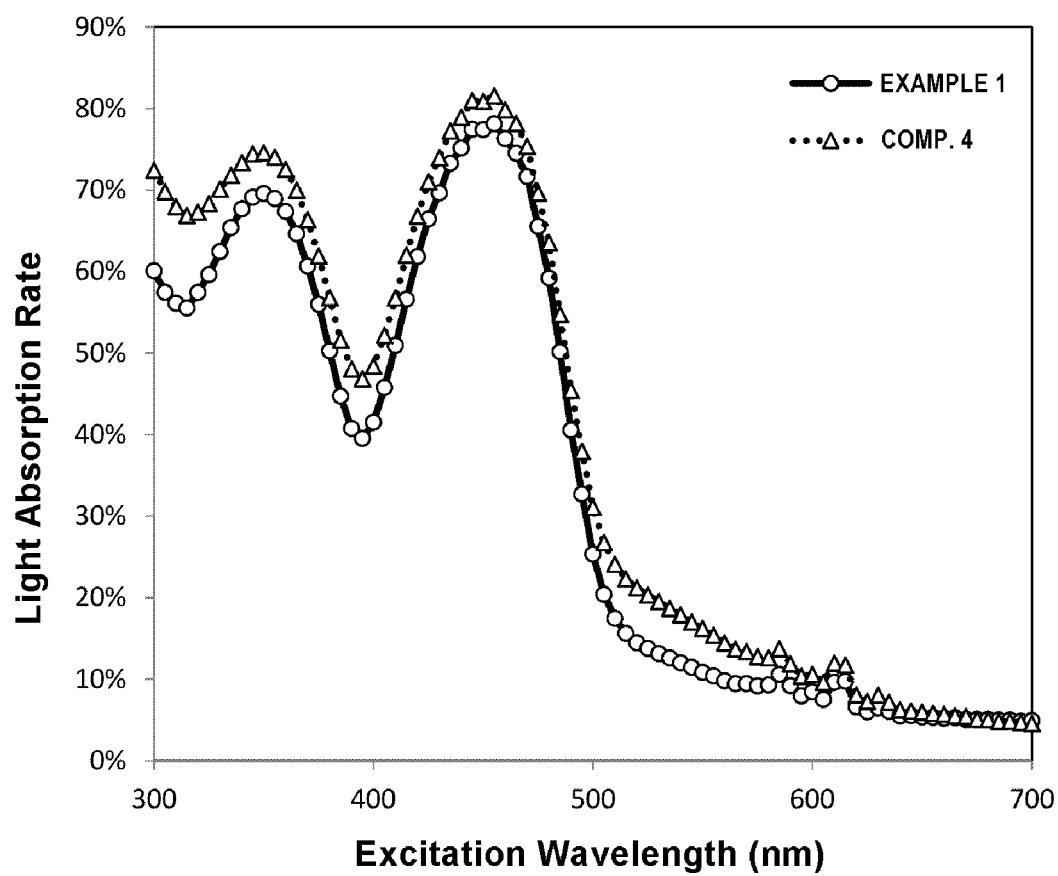

PHOSPHOR, LIGHT EMITTING DEVICE, AND METHOD FOR PRODUCING PHOSPHOR

CROSS-REFERENCE TO RELATED APPLICATIONS

This application is a U.S. National Phase Application of PCT/JP2016/052360, filed Jan. 27, 2016, which claims priority from JP 2015-013263, filed Jan. 27, 2015, the contents of which applications are incorporated herein by reference in their entireties for all purposes.

TECHNICAL FIELD

The present invention relates to a phosphor that efficiently emits red light when excited with blue light, a light emitting device using the same, and a method for producing the phosphor.

BACKGROUND ART

Patent Document 1 discloses a red light emitting phosphor represented by $A_2[MF_6]:Mn^{4+}$ in which the elements A each represents Li, Na, K, Rb, Cs, $NH_4$ or like, and the element M is Ge, Si, Sn, Ti, Zr, or like, and a method for producing the same. The red light emitting phosphor is produced by dissolving $K_2 MnF_6$ crystals containing an $A_2[MF_6]$ crystal as a matrix for the phosphor and Mn as an emission center in a hydrofluoric acid solution and evaporating the solution to dryness.

CITATION LIST

Patent Literature

Patent Document 1: Japanese Patent Application Laid-open Publication No. 2009-528429 A

SUMMARY OF THE INVENTION

Technical Problem

However, the conventional phosphor of the prior art has insufficient optical properties and requires further improvement of fluorescence intensity for practical use. Accordingly, an object of the present invention is to provide an $A_2M_6:M^{4+}$ phosphor having higher fluorescence intensity, a light emitting device with high luminance using the phosphor and a method for producing the phosphor.

Solution to Problem

The present invention relates to a phosphor represented by the general formula: $A_2MF_6:Mn$ in which the elements A each represents an alkali metal element, the element M represents one or more tetravalent metallic elements selected from Si, Ge, Sn, Ti, Zr and Hf; the phosphor having a minimal (local minimum) light absorption rate in a wavelength range of 300 nm or more and 350 nm or less of 67% or less, and a maximum light absorption rate in a wavelength range of 400 nm or more and 500 nm or less of 65% or more, the phosphor having a Mn content of 0.3% by mass or more and 1.5% by mass or less. The phosphor may preferably have an average particle diameter of 10 μm or more and 35 μm or less.

The present invention relates to a light emitting device comprising the phosphor and a light source, the light source having a peak wavelength of 420 nm or more and 480 nm or less.

The light emitting device may preferably comprise, as a phosphor component, the above phosphor and a green phosphor having a peak wavelength of 510 nm or more and 550 nm or less when receiving excitation light of 455 nm. The green phosphor for the light emitting device may be preferably β-SiAlON activated with Eu.

The present invention relates to a method for producing the phosphor as stated above. The method comprises the steps of: dissolving raw materials in hydrofluoric acid to obtain an aqueous hydrofluoric acid solution; precipitating the phosphor in the solution after the dissolving step; and washing the phosphor to remove impurities, wherein the aqueous hydrofluoric acid aqueous solution obtained in the dissolving step contains the element A, the elements M, and Mn, and wherein the precipitating step comprises evaporating the aqueous hydrofluoric acid solution after the dissolving step.

The present invention also relates to a method for producing the phosphor as stated above, the method comprising the steps of: dissolving raw materials in hydrofluoric acid to obtain an aqueous hydrofluoric acid solution; precipitating the phosphor in the solution after the dissolving step; and washing the phosphor to remove impurities, wherein the aqueous hydrofluoric acid solution obtained in the dissolving step contains the element A, the elements M, and Mn, and wherein the precipitation step comprises adding a poor solvent to the aqueous hydrofluoric acid solution. The poor solvent may preferably be water.

The present invention also relates a method for producing the phosphor as stated above, the method comprising the steps of: dissolving raw materials in hydrofluoric acid; precipitating the phosphor in the solution after the dissolving step; and washing the phosphor to remove impurities, wherein the dissolving step comprises preparing two or more aqueous hydrofluoric acid solutions containing the element A, the elements M, and Mn, and wherein the precipitation step comprises mixing the two or more aqueous hydrofluoric acid solutions with each other to allow them to react.

Advantageous Effects of Invention

The present phosphor can provide efficient fluorescence emission and high fluorescence intensity once receiving excitation light. The light emitting device according to an embodiment of the present invention can have high luminance because the device employs the phosphor. The method for producing the phosphor of the present invention can produce the phosphor with high fluorescence intensity.

BRIEF DESCRIPTION OF THE DRAWINGS

FIG. 1 is a reference diagram showing excitation wavelength dependencies of the absorption rates of phosphors according to Example 1 and Comparative Example 4.

DESCRIPTION OF EMBODIMENTS

The present invention relates to a phosphor represented by the general formula: $A_2MF_6:Mn$ in which the elements A each represents an alkali metal element, the element M represents one or more tetravalent metallic elements selected from Si, Ge, Sn, Ti, Zr and Hf; the phosphor having a minimal light absorption rate in a wavelength range of 300 nm or more and 350 nm or less of 67% or less, and a maximum light absorption rate in a wavelength range of 400 nm or more and 500 nm or less of 65% or more, the phosphor having a Mn content of 0.3% by mass or more and 1.5% by mass or less. The element A may be an alkali metal element, and preferably one or more elements selected from Na, K and Rb in terms of the crystal structure.

The element M is one or more metallic elements selected from Si, Ge, Sn, Ti, Zr and Hf, and preferably Si, Ge and Ti in terms of fluorescence properties and chemical stability. The fluorescent properties of the phosphor may depend on the type of the element M. F is fluorine and Mn is manganese. Mn can take a variety of oxidation numbers, and among them, $Mn^{4+}$ functions as a luminescent center substance of the phosphor according to the present invention.

The $Mn^{4+}$ for activating the phosphor has excitation bands in a wavelength range of 300 nm or more and 400 nm or less and a wavelength range of 400 mm or more and 500 nm or less. A peak wavelength in the excitation band may vary depending on the type of the element M, and the peak wavelength in the excitation band on the longer wavelength region may be 440 nm or more and 480 nm or less.

The peak wavelength in the excitation band on the longer wavelength region coincides with an emission wavelength of a blue LED used as an excitation source for a white LED. If the light absorption rate in the wavelength range is less than 65%, the luminance of the light emitting device using the phosphor cannot be sufficiently obtained. Therefore, the maximum light absorption rate in the wavelength range of 400 nm to 500 nm may be 65%, and more preferably 66% or more, and further preferably 68% or more, and still more preferably 78% or more.

In the phosphor according to the present invention, the minimal light absorption rate appearing in the wavelength range of 300 nm to 350 nm is 67% or less, for the following reasons:

The light absorption of ultraviolet light in the wavelength range of 300 nm or more and 350 nm or less negatively correlates with internal quantum efficiency of the phosphor (i.e., efficiency of converting absorbed excitation photons into fluorescence photons).

The light absorption may be caused by impurities and crystal defects, in addition to the excitation of $Mn^{4+}$. The crystal defects trap electrons excited by $Mn^{4+}$, and inhibit the emission of light. The present inventors have found that the absorption in ultraviolet light region derived from the crystal defects and the absorption band of $Mn^{4+}$ near the wavelength of 350 nm overlap with each other.

There is the minimal light absorption rate in the wavelength range of 300 nm or more and 350 nm or less, and the lower the minimal light absorption rate, the higher the internal quantum efficiency. Therefore, the "minimal light absorption rate in a wavelength of 300 nm or more and 350 nm or less" is "67% or less". The minimal light absorption rate may be preferably 66% or less, and more preferably 56% or less.

The present phosphor has the maximum light absorption rate in the wavelength range of 400 nm or more and 500 nm or less is 65% or more in order to obtain sufficient luminance in the light emitting device using the phosphor.

The Mn content in the present phosphor is 0.3% by mass or more and 1.5% by mass or less. If the Mn content is too low, sufficient fluorescence emission will tend not to be obtained, whereas if the Mn content is too high, the fluorescence emission will tend to be decreased due to increased crystal defects and concentration quenching.

The average particle diameter of the phosphor according to the present invention may preferably be 10 μm or more and 35 μm or less. The average particle size is a volume median diameter determined from a particle size distribution curve as measured by a laser diffraction scattering method.

If the average particle size is excessively small, the light absorption rate will be significantly decreased, so that the fluorescence intensity will tend to be decreased. If the average particle size is too large, the amount of the phosphor added for obtaining predetermined color will be increased, so that dispenser blockage will tend to occur during implementation.

The present invention relates a light emitting device comprising the phosphor as stated above and a light source, the light source having a peak wavelength of 420 nm or more and 480 nm or less. The peak wavelength of the emission source of 420 nm or more and 480 nm or less effectively excites $Mn^{4+}$ serving as the luminescent center in the phosphor and thus the phosphor can work as blue light for the light emitting device.

The phosphor according to the present invention has high fluorescence intensity due to the features as described above. Specifically, the high fluorescence intensity as used herein means that the internal quantum efficiency is 70% or more and the external quantum efficiency is 57% or more.

The light emitting device preferably has the phosphor as stated above and a green phosphor having a peak wavelength of 510 nm or more and 550 nm or less when receiving excitation light of 455 nm, as a phosphor component. The light emitting device can emit white light with a blue light source, the red phosphor and the green phosphor, and can further emit different color ranges by different mixing ratios of the phosphors. The use of a Eu-activated β-SiAlON phosphor having a fluorescence spectrum with narrower half width as the green phosphor can provide a backlight source for liquid crystals having high color ranges.

The phosphor according to the present invention can be produced by the following methods:
1) solvent evaporation method: elements that are raw materials for the phosphor are dissolved in a hydrofluoric acid solvent and the solvent is then evaporated;
2) poor solvent addition and precipitation method: a poor solvent is added to precipitate the phosphor;
3) mixing reaction and precipitation method: two or more hydrofluoric acid solutions in which elements that are raw materials for the phosphor have been dissolved are mixed to react and precipitate the phosphor.

In any of the above producing methods, it is important to prevent generation of crystal defects as possible, since the defects trap excited electrons of $Mn^{4+}$ in the process of crystal growth and will deteriorate light emission.

Example

Hereinafter, the present invention will be described in detail with reference to Examples and Comparative Examples.

Example 1

The phosphor of Example 1 was the phosphor represented by the general formula: $A_2MF_6$:Mn in which the element A is K (potassium), the element M is Si (silicon), the minimal light absorption rate appearing in the wavelength range of 300 nm or more and 350 nm or more was 55.5%, the maximum light absorption rate in the wavelength range of 400 nm or more and 500 nm or less was 78.1%, the Mn content was 0.75% by mass, and the average particle diameter was 29.8 μm. These characteristic values and effects of the invention as described below are shown in Table 1.

The average particle diameter of the phosphor of Example 1 was determined by measuring the particle size distribution by a laser diffraction scattering type particle size distribution

TABLE 1

| | Raw Material | | Phosphor | | | | Evaluation | |
|---|---|---|---|---|---|---|---|---|
| | $K_2SiF_6$ | $K_2MnF_6$ | | | | Average | Excitation Wavelength: 455 nm | |
| | Addition | Addition | Light Absorption Rate (%) | | Mn | Particle | Internal | External |
| | Amount (g) | Amount (g) | 300-350 nm Minimal | 400-500 nm Maximum | Content (mass %) | Diameter (μm) | Quantum Efficiency (%) | Quantum Efficiency (%) |
| EX. 1 | 30 | 5 | 55.5 | 78.1 | 0.75 | 29.8 | 82.5 | 64.4 |
| EX. 2 | 30 | 2.5 | 52.3 | 68.8 | 0.41 | 28.7 | 86.8 | 57.7 |
| EX. 3 | 30 | 7.5 | 65.2 | 82.5 | 0.92 | 30.5 | 76.8 | 63.4 |
| EX. 4 | 50 | 8.3 | 63.1 | 80.5 | 0.71 | 31.8 | 78.2 | 63.0 |
| COMP. 1 | 30 | 10 | 72.5 | 87.2 | 1.62 | 30.8 | 62.4 | 54.4 |
| COMP. 2 | 30 | 1 | 49.8 | 54.2 | 0.21 | 27.7 | 84.4 | 45.7 |
| COMP. 3 | 60 | 8.3 | 69.3 | 73.2 | 0.65 | 30.3 | 76.5 | 56.0 |

The method for measuring the characteristic values of the phosphor of Example 1 and the method for producing the phosphor will be described.

The excitation wavelength dependence of the light absorption rate of the phosphor of Example 1 was measured at normal temperature by the following method:

A standard reflector (Spectralon available from Labsphere, Inc.) having a reflectance of 99% was set on a side opening (φ 10 mm) of an integrating sphere (φ 60 mm). In the integrating sphere, monochromatic light obtained by dispersing light from a Xe lamp as a light source to a predetermined wavelength was introduced as excitation light through an optical fiber, and the reflected light spectrum of the standard reflector was measured with a spectrophotometer (MCPD-7000 available from OTSUKA ELECTRONICS Co., Ltd.) in the wavelength range of 220 to 800 nm. The excitation light was applied at intervals of 5 nm in the range of 300 nm or more and 700 nm or less, and the spectrum of the reflected light was measured for each excitation light.

A concave cell was filled with the phosphor such that the surface of the phosphor was smooth. The filled cell was set in the opening of the integrating sphere, the monochromatic light was applied at intervals of 5 nm in the range of 300 nm or more and 700 nm or less and the spectrum was measured with excitation light of each wavelength.

The resulting spectra were a reflection spectrum of the excitation light and a fluorescence spectrum near red color.

For the resulting spectra, the light absorption rate of the phosphor at each excitation wavelength was determined by measuring the number of excitation reflected light photons in the range of −5 nm to +10 nm of the set excitation wavelength and dividing the measured number of excitation reflected light photons in the phosphor by the value of the standard reflector. FIG. 1 shows a diagram obtained by plotting the light absorption rate of the phosphor of Example 1 as determined relative to the excitation wavelength.

For the light absorption rate, the maximum values of the light absorption rate were shown at excitation wavelengths of 350 nm and 450 nm due to excitation of $Mn^{4+}$. The minimal light absorption rate appeared in the wavelength range of 300 nm or more and 350 nm or less was 55.5%, and the maximum light absorption rate in the wavelength range of 400 nm or more and 500 nm or less was 78.1%.

The Mn content in the phosphor of Example 1 was 0.75% by mass as measured by ICP (Inductively Coupled Plasma) emission spectroscopic analysis.

measuring apparatus (LC13 320 available from Beckman Coulter, Inc.), and calculating the average particle diameter (50 vol. % diameter; D50) from the resulting cumulative particle size distribution curve. The average particle diameter of the phosphor of Example 1 was 29.8 μm. Ethanol was used as a solvent for measurement in the measuring apparatus.

The internal quantum efficiency and the external quantum efficiency for the excitation wavelength of 455 nm were determined by the following method:

In the spectrum for the standard reflector, the number of excitation light photons (Qex) was calculated from the spectrum in the wavelength range of 450 nm or more and 465 nm or less.

The number of excitation reflected light photons (Qref) and the number of fluorescence photons (Qem) were calculated from the spectrum for the phosphor.

The number of excitation reflected light photons was calculated in the same wavelength range as that of the number of excitation light photons, and the number of fluorescence photons was calculated in a range of 465 to 800 nm. The external quantum efficiency (=Qem/Qex×100) and the internal quantum efficiency (=Qem/(Qex−Qref)×100) were calculated from the resulting numbers of photons.

The internal quantum efficiency and external quantum efficiency of the phosphor of Example 1 excited at the wavelength of 455 nm were 82.5% and 64.4%, respectively.

The method for producing the phosphor of Example 1 will be described.

The phosphor of Example 1 was produced by the poor solvent addition and precipitation method as described above. The poor solvent addition and precipitation method employed a dissolving step for dissolving raw materials in hydrofluoric acid, a precipitation step for precipitating the phosphor in the solution after the dissolving step, and a washing step for removing impurities.

For the raw materials of the phosphor, $K_2$ $SiF_6$ (available from Morita Chemical Industries, Ltd., purity of 98% or more) and $K_2$ $MnF_6$ were employed. Both materials were in the form of powder. A producing step of $K_2$ $MnF_6$ will be described.

<Step of Producing $K_2$ $MnF_6$>

800 ml of hydrofluoric acid having a concentration of 40% by mass was placed in one liter Teflon® beaker. Then 260 g of $KHF_2$ powder (available from Wako Pure Chemical Industries, Ltd., special grade reagent) and 12 g of potassium permanganate powder (available from Wako Pure Chemical Industries, Ltd., first class grade reagent) were dissolved in the solution.

8 ml of 30% hydrogen peroxide water (available from Wako Pure Chemical Industries, Ltd., special grade reagent) was gradually added dropwise while stirring the hydrofluoric acid reaction solution with a magnetic stirrer.

Once the amount of hydrogen peroxide water dropped exceeded a certain amount, yellow particles began to be separated, and the color of the reaction solution began to change from purple. After a certain amount of hydrogen peroxide water was added dropwise and stirring was continued for a certain period of time, the stirring was stopped to precipitate the separated particles. All of the above reactions were carried out at normal temperature.

<Step of Washing $K_2 MnF_6$>

After the precipitation, a supernatant was removed, methanol was added, stirred and left to stand, a supernatant was removed, and methanol was further added. These procedures were repeated until the solution reached neutrality.

The precipitated particles were then collected by filtration and further subjected to drying, and methanol was completely removed by evaporation to yield 19 g of $K_2 MnF_6$ powder.

<Step of Producing Phosphor>

1000 ml of hydrofluoric acid having a concentration of 55% by mass was placed in a 3000 ml Teflon® beaker. Then 30 g of $K_2 SiF_6$ powder (Morita Chemical Industries, Ltd., purity of 98% or more) and 5 g of $K_2 MnF_6$ as stated above were added to the beaker and thoroughly stirred to dissolve them.

1500 ml of distilled water was poured from a beaker for about 1 minute while stirring the aqueous hydrofluoric acid solution. It was visually confirmed that yellow powder was formed in the reaction solution once pouring the distilled water. All of these producing steps were carried out at normal temperature.

<Step of Washing Phosphor>

After pouring the whole amount of distilled water, the solution was further stirred for 20 minutes and then allowed to stand to precipitate a solid. After the precipitation was confirmed, a supernatant was removed, a solid portion was washed with 20% by mass of hydrofluoric acid and methanol, and the solid portion was separated and recovered by filtration, and residual methanol was further evaporated and removed by a drying treatment to obtain yellow colored phosphor powder.

The X-ray diffraction pattern of the phosphor of Example 1 was measured using an X-ray diffractometer (Ultima IV available from Rigaku Corporation). This demonstrated that the phosphor of Example 1 had $K_2 SiF_6$ crystal as a single phase.

Examples 2-4 and Comparative Examples 1-3

In each of Examples 2 to 4 and Comparative Examples 1 to 3, the phosphor was produced in the same method as that of Example 1, with the exception that amounts of $K_2 SiF_6$ and $K_2 MnF_6$ were changed as shown in the column of "Raw Material" in Table 1.

As for the phosphor of Comparative Example 1, the minimal light absorption rate appearing in the wavelength range of 300 nm or more and 350 nm or less was more than 67% and the Mn content was more than 1.5% by mass. Therefore, both the internal quantum efficiency and the external quantum efficiency were not acceptable.

As for the phosphor of Comparative Example 2, the maximum light absorption rate appearing in the wavelength range of 400 nm or more and 500 nm or less was less than 65% and the Mn content was more than 1.5% by mass. Therefore, the external quantum efficiency was not acceptable.

As for the phosphor of Comparative Example 3, the minimal light absorption rate appearing in the wavelength range of 300 nm or more and 350 nm or less was greater than 67%. Therefore, the external quantum efficiency was not acceptable.

Comparative Example 4

The phosphor of Comparative Example 4 was produced by a mixing reaction and precipitation method which was a producing method different from the above Examples, although not shown in Table 1.

At normal temperature, 250 ml of hydrofluoric acid having a concentration of 55% by mass was placed in a 500 ml Teflon® beaker, and 12 g of $SiO_2$ powder (Pure Chemical Industries, Ltd., purity of 99.9%) and 4 g of $K_2 MnF_6$ powder ($K_2 MnF_6$ prepared in Example 1) were added to the beaker and dissolved to prepare a hydrofluoric acid solution X.

On the other hand, 100 ml of hydrofluoric acid having a concentration of 55% by mass was placed in a 300 ml Teflon® beaker, and 46.9 g $KHF_2$ powder (available from Wako Pure Chemical Industries, Ltd., special grade reagent) was added to the beaker and dissolved to prepare a hydrofluoric acid solution Y.

The hydrofluoric acid solution Y was added to the hydrofluoric acid solution X while stirring with a stirrer. The phosphor was separated in the solution X by the addition of the solution Y. After the whole amount of the solution Y was added, the mixture was stirred for 20 minutes and then allowed to stand to precipitate a solid.

After the precipitation was confirmed, a supernatant was removed, a solid portion was washed with 20% by mass of hydrofluoric acid and methanol, and the solid portion was separated and recovered by filtration, and further dried to obtain yellow colored phosphor powder.

The phosphor of Comparative Example 4 had a $K_2 SiF_6$ crystal as a single phase, the minimal light absorption rate appearing in the wavelength range of 300 nm to 350 nm was 67.3%, the maximum light absorption rate in the wavelength range of 400 to 500 nm was 81.5%, the Mn content was 0.68% by mass, and the average particle diameter was 30.2 µm.

FIG. 1 shows the excitation wavelength dependence of the light absorption rate of Comparative Example 4.

The internal quantum efficiency and the external quantum efficiency of the phosphor of Comparative Example 4 were 68.9% and 56.1%, respectively. In the phosphor of Comparative Example 4, the Mn content and particle size distribution were similar to those of Example 1, but as shown in FIG. 1, both the internal quantum efficiency and external quantum efficiency were lower, which reflected the difference in excitation wavelength dependence of the light absorption rate.

Example 5

The phosphor of Example 5 was the phosphor represented by the general formula: $A_2 MF_6$:Mn in which the element A is K (potassium), the element M is Ge (germanium), the minimal light absorption rate appearing in the wavelength range of 300 nm or more and 350 nm or less was 46.0%, the maximum light absorption rate in the wavelength range of 400 nm or more and 500 nm or less was 79.6%, the Mn content was 0.61% by mass, and the average particle size was 38.4 μm. These characteristic values and effects of the invention as described below are shown in Table 2.

Although not shown as a working example, the solvent evaporation method could provide a phosphor equivalent to that of Example 1 by performing synthesis in which the generation of crystal defects was suppressed as much as possible.

TABLE 2

| | | | Phosphor | | | | |
|---|---|---|---|---|---|---|---|
| | | X-ray | Light Absorption Rate (%) | | Mn | Average Particle | Evaluation Excitation Wavelength: 455 nm |
| | $KHF_2$ Addition Method | Diffraction (Crystal Phase) | 300-350 nm Minimal | 400-500 nm Maximum | Content (Mass %) | Diameter (μm) | Internal Quantum Efficiency (%) | External Quantum Efficiency (%) |
| EX. 5 | Solution | $K_2GeF_6$ | 46.0 | 79.6 | 0.62 | 38.4 | 84.3 | 66.2 |
| COMP. 5 | Powder | $K_2GeF_6$ | 67.5 | 58.8 | 0.58 | 40.2 | 59.2 | 33.7 |

The method for producing the phosphor of Example 5 will be described.

The method for producing the phosphor in the Example 5 is the mixing reaction and precipitation method.

At normal temperature, 250 ml of hydrofluoric acid having a concentration of 48% by mass was placed in a 500 ml Teflon® beaker, and 20.9 g of $GeO_2$ powder (available from Pure Chemical Industries, Ltd., purity of 99.99%) and 3 g of $K_2MnF_6$ powder ($K_2MnF_6$ prepared in Example 1) were added to the beaker and dissolved to prepare a hydrofluoric acid solution.

In Example 5, to this solution was added a solution of 46.9 g of $KHF_2$ powder dissolved in 100 ml of hydrofluoric acid having a concentration of 48% by mass.

A phosphor was separated by the solution of $KHF_2$ in hydrofluoric acid. After adding the total amount of the solution of $KHF_2$ in hydrofluoric acid, the mixture was stirred for 20 min and then allowed to stand to precipitate a solid. After confirming the precipitation, a supernatant was removed.

The precipitate was repeatedly washed with 20% by mass of hydrofluoric acid until bright yellow color was obtained, and further washed with methanol, and the solid portion was separated and recovered by filtration. The residual methanol was further evaporated and removed by a drying treatment to obtain the phosphor of Example 5.

Both the internal quantum efficiency and the external quantum efficiency of Example 5 were acceptable.

The phosphor of Comparative Example 5 was produced by the method of Example 5, with the exception that the "solution of 46.9 g of $KHF_2$ powder dissolved in 100 ml of hydrofluoric acid having a concentration 48% by mass" in Example 5 was changed to "46.9 g of $KHF_2$ powder". The characteristic values and evaluation are shown in Table 2.

In Comparative Example 5, the internal quantum efficiency and the external quantum efficiency were lower than those of Example 5, because the minimal light absorption rate observed near 300 nm was very high, the particle diameter was smaller and the light absorption rate around 450 nm was lower. The addition of $KHF_2$ in the form of powder, rather than in the form of solution, led to reduced growth of the crystal.

The phosphors of Examples 6 and 7 were the same as the phosphor of Example 1, with the exception that the average particle diameters were 8 μm and 40 μm, respectively, although not shown in the tables. The internal quantum efficiency and the external quantum efficiency were lower than those in Example 1, but all of them were acceptable.

Example 8 illustrates a light emitting device comprising the phosphor of Example 1 and an LED as a light source, in which the peak wavelength of the LED is 455 nm. More particularly, the light emitting device is an illumination device. The light emitting device of Example 8 had high emission intensity because the phosphor of Example 1 was used.

Example 9 illustrates a light emitting device comprising the phosphor of Example 8 and a green phosphor having a peak wavelength of 528 nm when receiving excitation light of 455 nm. Specifically, the green phosphor is $(Ba,Sr)_2SiO_4$:Eu. The light emitting device emitted white light because the device used the green phosphor.

The light emitting device of Example 9 had high emission intensity because the device used the phosphor of Example 1.

Example 10 illustrates a light emitting device similar to that of Example 9, with the exception that $(Ba,Sr)_2SiO_4$:Eu of Example 9 was changed to β-SiAlON activated with Eu.

The light emitting device of Example 10 had improved stability at an elevated temperature and improved moisture resistance as compared with Example 9.

What is claimed is:

1. A phosphor represented by the general formula: $A_2MF_6$:Mn in which the elements A each represents an alkali metal element, the element M represents one or more tetravalent metallic elements selected from Si, Ge, Sn, Ti, Zr and Hf; the phosphor having a minimal light absorption rate in a wavelength range of 300 nm or more and 350 nm or less of 67% or less, and a maximum light absorption rate in a wavelength range of 400 nm or more and 500 nm or less of 65% or more, the phosphor having a Mn content of 0.3% by mass or more and 1.5% by mass or less.

2. The phosphor according to claim 1, wherein the phosphor has an average particle diameter of 10 μm or more and 35 μm or less.

3. A light emitting device comprising the phosphor according to claim 1 and a light source, the light source having a peak wavelength of 420 nm or more and 480 nm or less.

4. The light emitting device according to claim 3, wherein the light emitting device further comprises a green phosphor having a peak wavelength of 510 nm or more and 550 nm or less when receiving excitation light of 455 nm.

5. The light emitting device according to claim 4, wherein the green phosphor is β-SiAlON activated with Eu.

6. A method for producing the phosphor according to claim 1, comprising the steps of:

dissolving raw materials in hydrofluoric acid to obtain an aqueous hydrofluoric acid solution;

precipitating the phosphor in the solution after the dissolving step; and washing the phosphor to remove impurities, wherein the aqueous hydrofluoric acid aqueous solution obtained in the dissolving step contains the element A, the elements M, and Mn, and wherein the precipitating step comprises evaporating the aqueous hydrofluoric acid solution after the dissolving step.

7. A method for producing the phosphor according to claim comprising the steps of:

dissolving raw materials in hydrofluoric acid to obtain an aqueous hydrofluoric acid solution;

precipitating the phosphor in the solution after the dissolving step; and washing the phosphor to remove impurities, wherein the aqueous hydrofluoric acid solution obtained in the dissolving step contains the element A, the elements M, and Mn, and wherein the precipitation step comprises adding a poor solvent to the aqueous hydrofluoric acid solution.

8. The method for producing the phosphor according to claim 7, wherein the poor solvent is water.

9. A method for producing the phosphor according to claim 1, comprising the steps of:

dissolving raw materials in hydrofluoric acid;

precipitating the phosphor in the solution after the dissolving step; and washing the phosphor to remove impurities, wherein the dissolving step comprises preparing two or more aqueous hydrofluoric acid solutions containing the element A, the elements M, and Mn, and wherein the precipitation step comprises mixing the two or more aqueous hydrofluoric acid solutions with each other to allow them to react.

* * * * *

UNITED STATES PATENT AND TRADEMARK OFFICE
CERTIFICATE OF CORRECTION

PATENT NO.         : 10,611,956 B2
APPLICATION NO.    : 15/546400
DATED              : April 7, 2020
INVENTOR(S)        : Hideyuki Emoto, Motoi Tanaka and Kazuhiro Ito It is certified that error appears in the above-identified patent and that said Letters Patent is hereby corrected as shown below:

In the Claims

In Claim 7 at Column 11, Lines 11-12, the wording "according to claim comprising" should read -- according to claim 1 comprising --.

Signed and Sealed this
Sixteenth Day of June, 2020

Andrei Iancu
*Director of the United States Patent and Trademark Office*